United States Patent
Lee et al.

(10) Patent No.: US 10,163,641 B2
(45) Date of Patent: Dec. 25, 2018

(54) MEMORY WITH A RAISED DUMMY FEATURE SURROUNDING A CELL REGION

(71) Applicant: TAIWAN SEMICONDUCTOR MANUFACTURING CO., LTD., Hsinchu (TW)

(72) Inventors: Chih-Ming Lee, Tainan (TW); Chiang-Ming Chuang, Changhua County (TW); Kun-Tsang Chuang, Mioli County (TW); Yung-Lung Hsu, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/236,531

(22) Filed: Aug. 15, 2016

(65) Prior Publication Data

US 2018/0047740 A1     Feb. 15, 2018

(51) Int. Cl.
*H01L 27/115*       (2017.01)
*H01L 21/28*        (2006.01)
*H01L 29/423*       (2006.01)
*H01L 27/11548*     (2017.01)

(52) U.S. Cl.
CPC .. *H01L 21/28273* (2013.01); *H01L 27/11548* (2013.01); *H01L 29/42328* (2013.01)

(58) Field of Classification Search
CPC ......... H01L 29/42328; H01L 29/66545; H01L 29/66825; H01L 29/788
See application file for complete search history.

(56) References Cited

U.S. PATENT DOCUMENTS

| | | | | |
|---|---|---|---|---|
| 2006/0226469 A1* | 10/2006 | Nakagawa | ............ | H01L 27/105 257/315 |
| 2008/0283900 A1* | 11/2008 | Nakagawa | ............ | H01L 27/105 257/321 |
| 2010/0090286 A1* | 4/2010 | Lee | ............ | H01L 27/11526 257/368 |
| 2014/0264525 A1* | 9/2014 | Takahashi | ............ | H01L 27/115 257/314 |
| 2016/0225785 A1* | 8/2016 | Kim | ............ | H01L 27/11575 |
| 2016/0260632 A1* | 9/2016 | Kang | ............ | H01L 21/31144 |

* cited by examiner

*Primary Examiner* — Peter Bradford
(74) *Attorney, Agent, or Firm* — McClure, Qualey & Rodack, LLP

(57) ABSTRACT

A semiconductor structure includes a semiconductor substrate, at least one raised dummy feature, and at least one memory cell. The raised dummy feature is present on the semiconductor substrate and defines a cell region and a non-cell region outside of the cell region on the semiconductor substrate, and the raised dummy feature has at least one opening communicating the cell region with the non-cell region. The memory cell is present on the cell region.

20 Claims, 16 Drawing Sheets

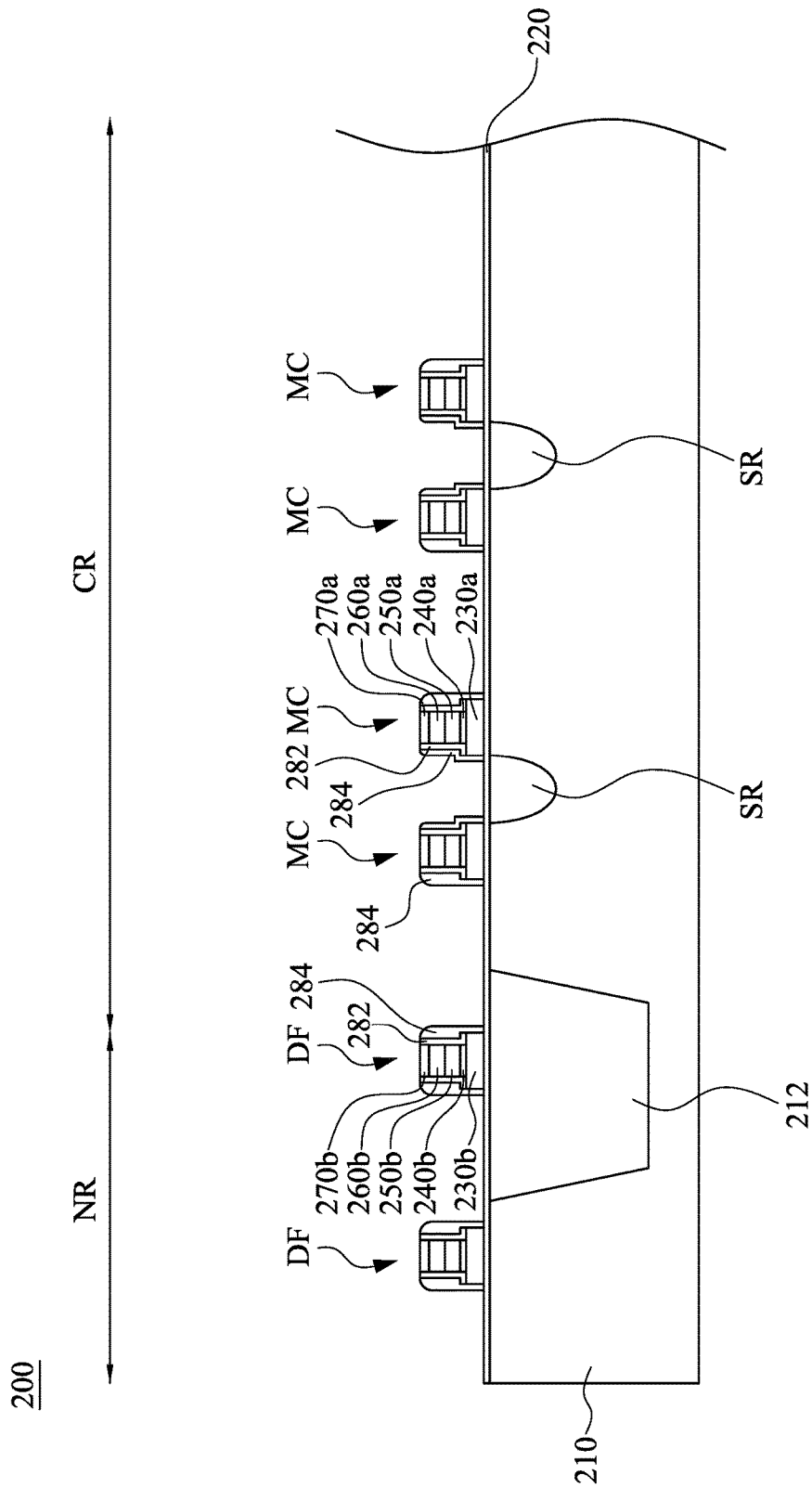

MEMORY WITH A RAISED DUMMY FEATURE SURROUNDING A CELL REGION

BACKGROUND

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is impetus in the designing of such circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E and FIGS. 2G-2L are cross-sectional views of a semiconductor structure at plural intermediate stages of the method for forming the semiconductor structure in accordance with some embodiments of the present disclosure.

DETAILED DESCRIPTION

Figure 1:
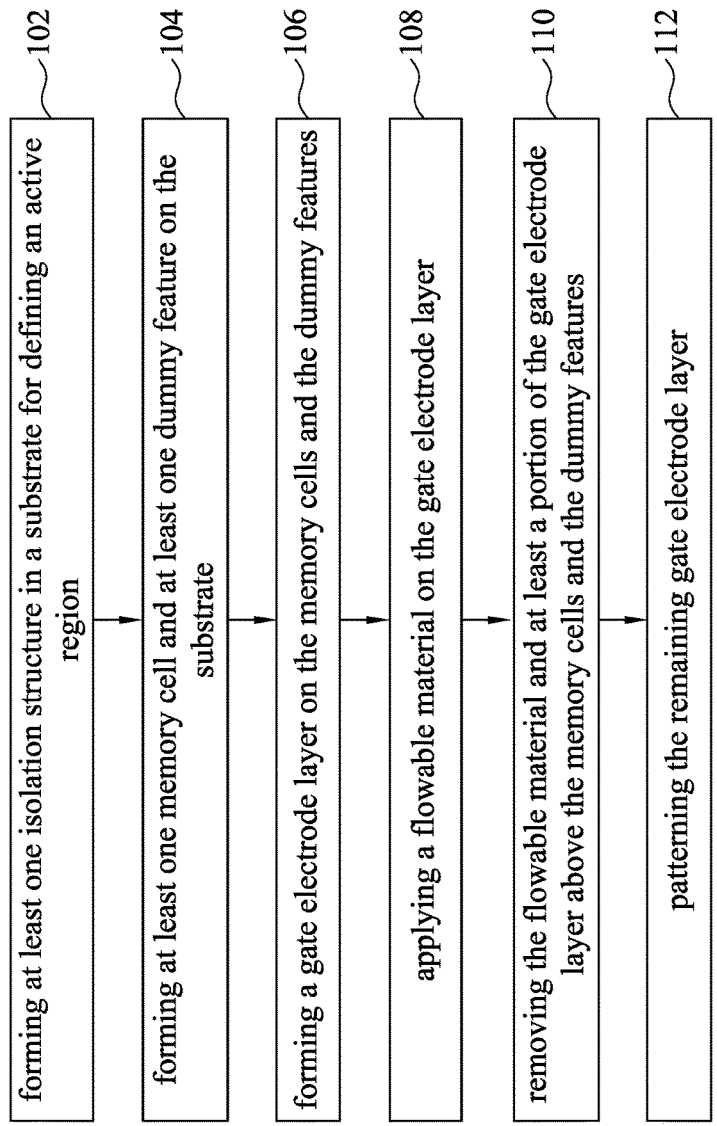
FIG. 1 is a flow chart of a method for forming a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 for forming a semiconductor structure according to some embodiments of the present disclosure. FIGS. 2A-2E and FIGS. 2G-2L are cross-sectional views of the semiconductor structure 200 at plural intermediate stages of the method 100 for forming the semiconductor structure 200 in accordance with some embodiments of the present disclosure. It is understood that additional steps may be implemented before, during, or after the method 100, and some of the steps described may be replaced or eliminated for other embodiments of the method 100. The semiconductor structure 200 and the method 100 making the same are collectively described with reference to various figures.

Figure 2A:
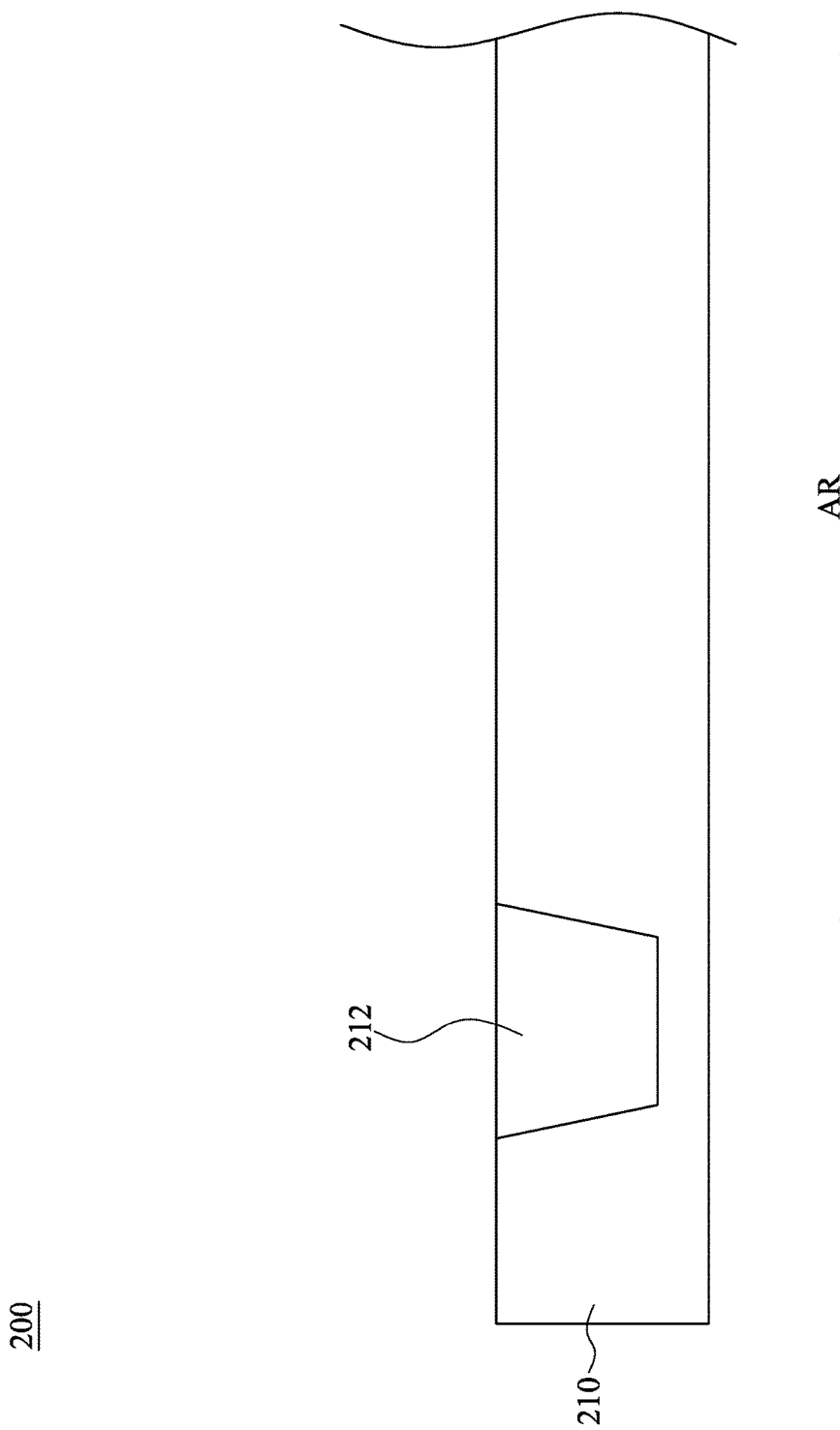

Referring to FIG. 1 and FIG. 2A, the method 100 begins at step 102 by forming at least one isolation structure 212 in a substrate 210. In some embodiments, the substrate 210 is a silicon substrate. In some other embodiments, the substrate 210 can be made of other materials, including silicon, carbon, germanium, gallium, arsenic, nitrogen, aluminum, indium, and/or phosphorus. The substrate 210 may also be a bulk substrate or have a semiconductor-on-insulator (SOI) structure.

The isolation structure 212, such as shallow trench isolation (STI) or local oxidation of silicon (LOCOS), may be disposed in the substrate 210 to define and electrically isolate at least one active region AR. In some embodiments, formation of a STI feature may include dry etching a trench in the substrate 210 and filling the trench with at least one insulating material, such as silicon oxide, silicon nitride, or silicon oxynitride. The filled trench may have a multilayer structure, such as a thermal oxide liner filled with silicon nitride or silicon oxide. In some embodiments, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with chemical vapor deposition (CVD) oxide, using chemical mechanical polishing (CMP) processing to etch back and planarize, and using a nitride stripping process to remove the silicon nitride.

In the cases wherein the substrate 210 has an semiconductor-on-insulator (SOI) structure, the trench may be deep enough to reach the buried oxide layer, so that the subsequently formed devices are enclosed in dielectric materials, and thus the leakage current is reduced.

The method 100 proceeds to step 104 by forming at least one memory cell and at least one dummy feature on the substrate 210. FIGS. 2B-2F illustrate formation of the memory cells MC and the dummy features DF. FIG. 2F is a schematic top view of the semiconductor structure 200 of FIG. 2E.

Figure 2B:
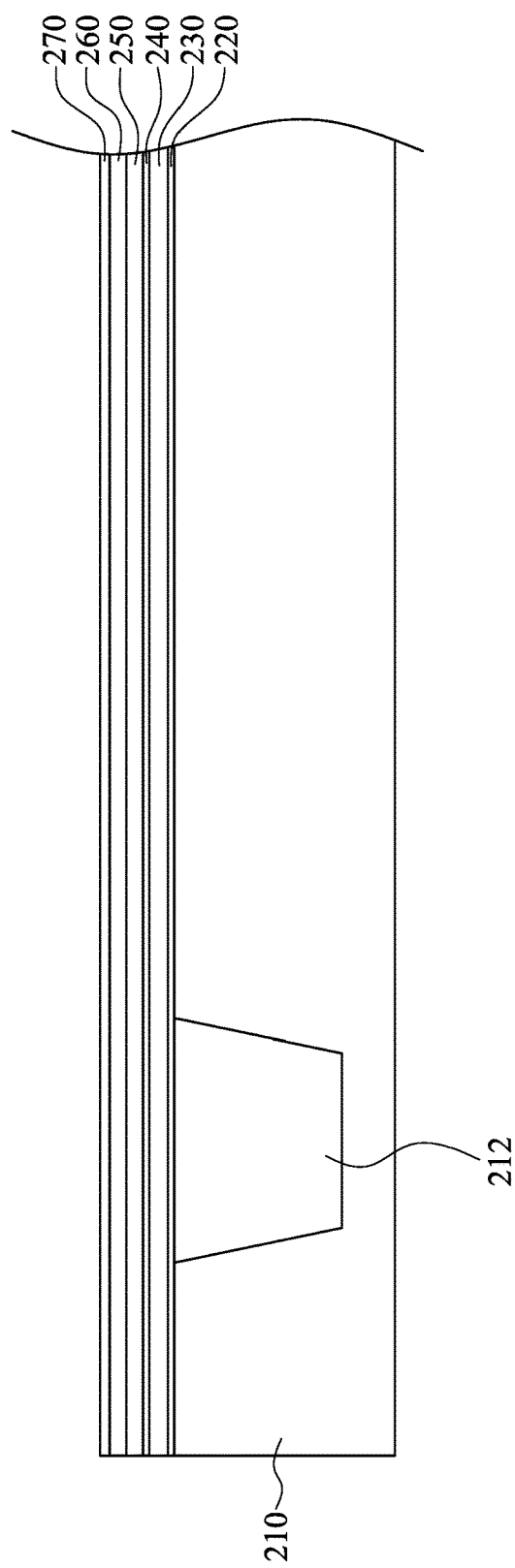

Referring to FIG. 2B, a tunneling layer 220, a floating gate layer 230, a blocking layer 240, a control gate layer 250, a first capping layer 260, and a second capping layer 270 are subsequently formed on the substrate 210.

The tunneling layer 220 may be an oxide layer formed by any oxidation process, such as wet or dry thermal oxidation or an in-situ steam generation (ISSG) process, in an ambient comprising $H_2O$, NO, or a combination thereof, or by a chemical vapor deposition (CVD) technique using tetraethyl-ortho-silicate (TEOS) and oxygen as precursors. The tunneling layer 220 may also include at least one high-k dielectric material, such as hafnium dioxide (HfO$_2$), silicon nitride, silicon oxynitride, or the like. In some embodiments, the tunneling layer 220 is less than about 200 angstroms in thickness. It should be appreciated, however, that the dimensions cited in the specification are examples, and these dimensions will change with the scaling of integrated circuits.

The floating gate layer 230, also sometimes referred to as a storage layer, is formed on the tunneling layer 220. In some embodiments, the floating gate layer 230 is a dielectric layer with a high trap density, which may include nitride. Charges are stored in the floating gate layer 230 around traps. Alternatively, the floating gate layer 230 includes at least one conductive material, such as polysilicon, amorphous silicon, or the like.

The blocking layer 240 may include a low-leakage dielectric material, such as HfO$_2$, or other dielectric materials, such as silicon oxide. The blocking layer 240 may be formed by, for example, physical vapor deposition (PVD), atomic layer chemical vapor deposition (ALCVD), metal-organic CVD (MOCVD), or the like. The effective oxide thickness of the blocking layer 240 may be less than about 170 angstroms.

In some embodiments, the control gate layer 250 includes doped polysilicon. For example, the control gate layer 250 may be heavily doped with phosphorus, arsenic or boron. The method for forming the control gate layer 250 may include, for example, PVD. The first capping layer 260 is a dielectric layer and may be made of a dielectric material, such as oxide, nitride, oxynitride, or combinations thereof. The second capping layer 270 is a dielectric layer and may be made of silicon nitride.

Figure 2C:
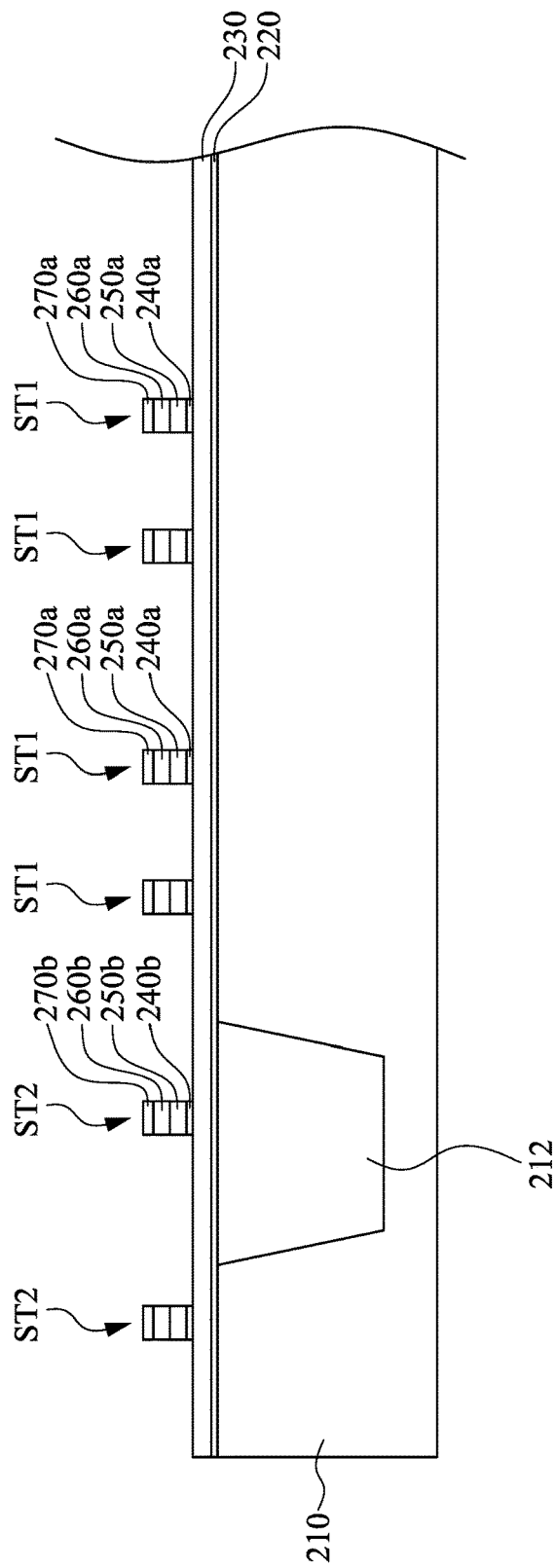

The blocking layer 240, the control gate layer 250, the first capping layer 260, and the second capping layer 270 are then patterned. Reference is made to FIG. 2C. FIG. 2C illustrates a resulting structure after the patterning the structure shown in FIG. 2B. The blocking layers 240a, the control gate layers 250a, the first capping layers 260a, and the second capping layers 270a are formed and stacked as the stack ST1, and the blocking layers 240b, the control gate layers 250b, the first capping layers 260b, and the second capping layers 270b are formed and stacked as the stack ST2. In some embodiments, the stacks ST1 are paired, such that every stack ST1 has a shorter distance from a proximate stack ST1 at one side and a longer distance from another proximate stack ST1 at the other side. Herein, though it is not shown, the stacks ST 2 surround the stacks ST1. The stacks ST1 and ST2 are respectively portions of memory cells and dummy features formed in subsequent processes.

Figure 2D:
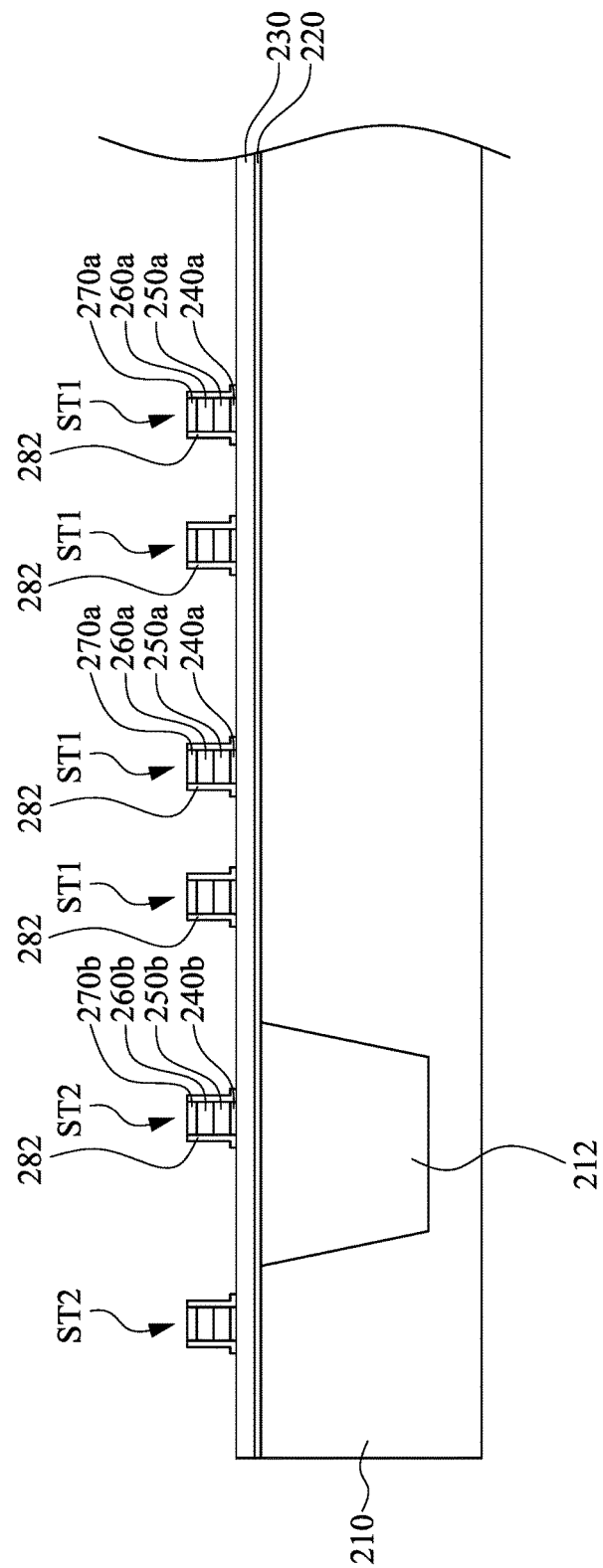

Reference is made to FIG. 2D. Plural first sidewall spacers 282 are formed on sidewalls of the stacks ST1 and the stacks ST2. The first sidewall spacers 282 may be made of nitride, silicon nitride, and/or other dielectric materials.

Figure 2E:
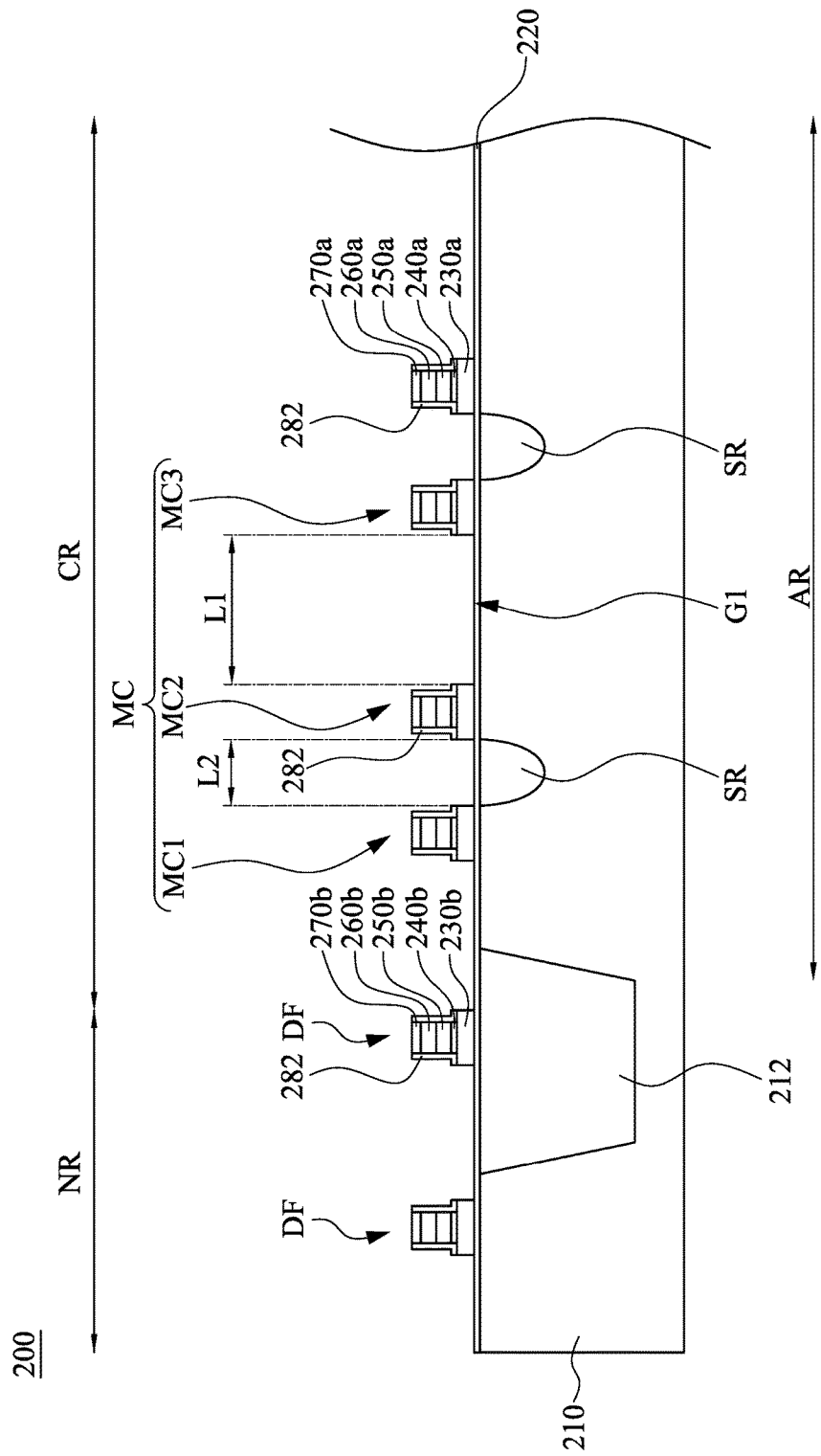
Figure 2F:
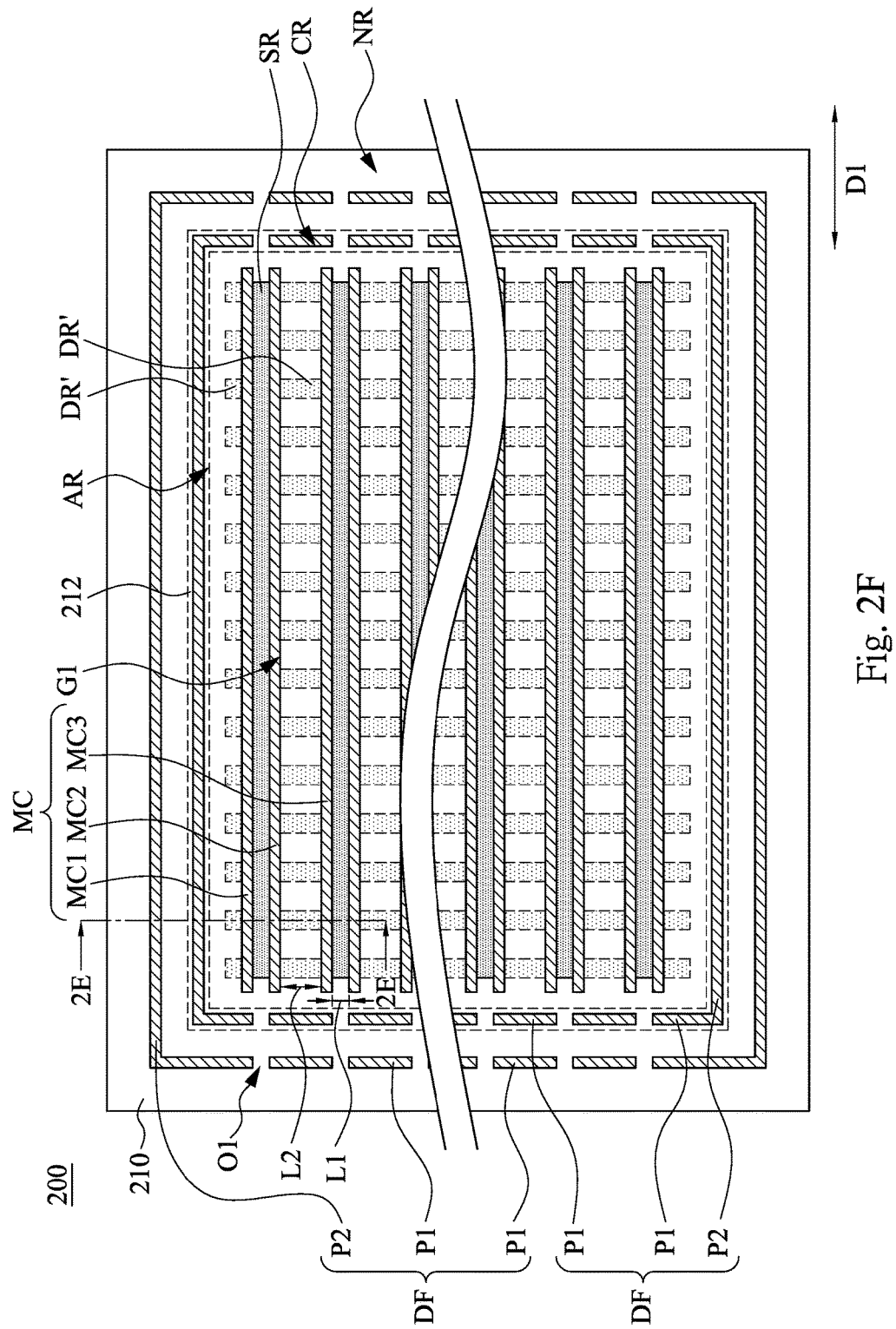
FIG. 2F is a schematic top view of the semiconductor structure of FIG. 2E.

Reference is made to FIG. 2E. The floating gate layer 230 (referring to FIG. 2D) is patterned to form the floating gate layers 230a and 230b. Herein, a dry etching process may be performed. The second capping layers 270a, the second capping layers 270b, and the first sidewall spacers 282 are used as masks to prevent the control gate layers 250a and the control gate layers 250b from etching away.

After the patterning process, at least one memory cell MC and at least one dummy feature DF are formed on the substrate 210. As shown in FIG. 2E, each of the memory cells MC includes a stack of the floating gate layer 230a, the blocking layer 240a, the control gate layer 250a, the first capping layer 260a, and the second capping layer 270a from bottom to top. Each of the dummy features DF includes a stack of the floating gate layer 230b, the blocking layer 240b, the control gate layer 250b, the first capping layer 260b, and the second capping layer 270b from bottom to top.

In some embodiments, the memory cells MC are paired, such that every memory cell MC has a shorter distance from a proximate memory cell MC at one side and a longer distance from another proximate memory cell MC at the other side. That is, the memory cells MC include a first memory cell MC1, a second memory cell MC2, and a third memory cell MC3 next to each other, a first distance L1 between the first memory cell MC1 and the second memory cell MC2 is less than a second distance L2 between the second memory cell MC2 and the third memory cell MC3, in which the first memory cell MC1 and the second memory cell MC2 are paired.

After the formation of the memory cells MC and the dummy features DF, at least one source region SR is formed in the substrate 210 between at least one pair of the memory cells MC. In some embodiments, the source regions SR may be formed by one or more ion implantation processes. Alternatively, in some other embodiments, the source regions SR may be portions of an epitaxy layer. Though it is not shown, in some embodiments, the source regions SR may extend beneath edge portions of the floating gate layers 230a.

Reference is made to FIG. 2E and FIG. 2F. FIG. 2F is a top view of the semiconductor structure 200 according to some embodiments of the present disclosure, while FIG. 2E is the cross-sectional view taken along line 2E-2E of FIG. 2F. In FIG. 2F, the isolation structure 212 is depicted as the region indicated by the dashed lines, and the memory cells MC and the dummy features DF are depicted as hatched patterns.

Herein, the pairs of the memory cells MC extend along a direction D1. Every pair of the memory cells MC are spaced apart by the first distance L1 for the deposition of the corresponding one of the source regions SR therebetween. Every two adjacent pairs of the memory cells MC have a space G1 with a width of the second distance L2 therebetween. The second distance L2 is greater than the first distance L1.

In the some embodiments, the dummy features DF partially surround the memory cells MC. To be specific, the dummy features DF have plural portions P1 located corresponding to the spaces G1 respectively and at least one opening O1 disposed between the portions P1. Herein, at least one of the dummy features DF defines a cell region CR and a non-cell region NR of the substrate 210. The plural pairs of the memory cells MC are disposed on the cell region CR for a flash memory device. Other non-memory devices, such as core devices, may be formed on the non-cell region NR. Herein, the portions P1 of the dummy features DF define the cell region CR, and the openings O1 communicating the cell region CR with the non-cell region NR.

In some embodiments, the dummy features DF at least partially laterally overlaps with the spaces G1 between every two adjacent pairs of the memory cells MC (e. g. the space G1 between the second memory cell MC2 and the third memory cell MC3). In other words, projections of spaces G1 between the second memory cell MC2 and the third memory cell MC3 on the dummy features DF are present external to the openings O1 of the dummy features DF so as to laterally overlap with the portions P1 of the dummy features DF. In some embodiments, the portions P1 of the dummy features DF may be respectively aligned with the spaces G1 one by one. Through the configuration, every two adjacent pairs of the memory cells MC and the corresponding portions P1 and may form limited spaces respectively.

In the present embodiments, the openings O1 of the dummy features DF may be aligned with the pairs of the memory cells MC. To be specific, the openings O1 of the dummy features DF at least partially laterally overlap with the pairs of the memory cells MC or the spaces above the source regions SR (i. e. the space between the paired memory cells) respectively. In some embodiments, projections of the pairs of the memory cells MC on the dummy features DF are at least partially overlapped with the openings O1 of the dummy features DF respectively. In some other embodiments, the spaces above the source regions SR are at least partially overlapped with the openings O1 of the dummy features DF respectively. Through the configuration, the dummy features DF may occupy less space on the substrate 210.

Herein, the memory cells MC are surrounded by two dummy features DF, one of the dummy features DF is formed on the isolation structure 212, and the other of the dummy features DF is formed away from the isolation structure 212. However, the number and locations of the dummy features DF should not limit various embodiments of the present disclosure. In some embodiments, the memory cells MC are surrounded by one dummy feature DF. In some embodiments, the dummy features DF may be all formed on the isolation structure 212 or all formed away from the isolation structure 212 and out of the active region AR.

In FIG. 2F, there are plural predetermined regions DR' adjacent to the memory cells MC, depicted as the regions indicated by dashed lines and filled with dotted patterned. The predetermined regions DR' indicates positions of plural drain regions which are to be formed in the subsequently processes. The configuration of the common source regions SR illustrated herein is not intended to limit various embodiments of the present disclosure. In some embodiments, at least one common drain region may be disposed between at least one pair of the memory cells, and source regions are disposed respectively adjacent to the memory cells.

Referring to FIG. 2G, following ion implantation, plural second sidewall spacers 284 are formed adjacent to the first sidewall spacers 282 on the sidewalls of the memory cells MC and the dummy features DF. The second sidewall spacers 284 may be made of oxide, the combination of oxide, nitride and oxide (ONO), and/or other dielectric materials.

Herein, the second sidewall spacers 284 on the opposite sidewalls of the dummy features DF have the same structure, while the second sidewall spacers 284 on the opposite sidewalls of the memory cells MC have different structures respectively. For example, the second sidewall spacers 284 adjacent to the dummy features DF and one of the second sidewall spacers 284 adjacent to the memory cells MC have a thicker thickness adjacent to the controlling gate layer 250a and 250b and a thinner thickness adjacent to the floating gate layer 230a and 230b respectively. Comparatively, the other one of the second sidewall spacers 284 adjacent to the memory cells MC has a more uniform thickness than that of the second sidewall spacers 284 adjacent to the dummy features DF.

In some other embodiments, though it is not depicted, the second sidewall spacers 284 adjacent to the dummy features DF may be the same as the second sidewall spacers 284 adjacent to the memory cells MC respectively. Alternatively, the second sidewall spacers 284 adjacent to the dummy features DF may have different structures from any one of the second sidewall spacers 284 adjacent to the memory cells MC.

Figure 2H:
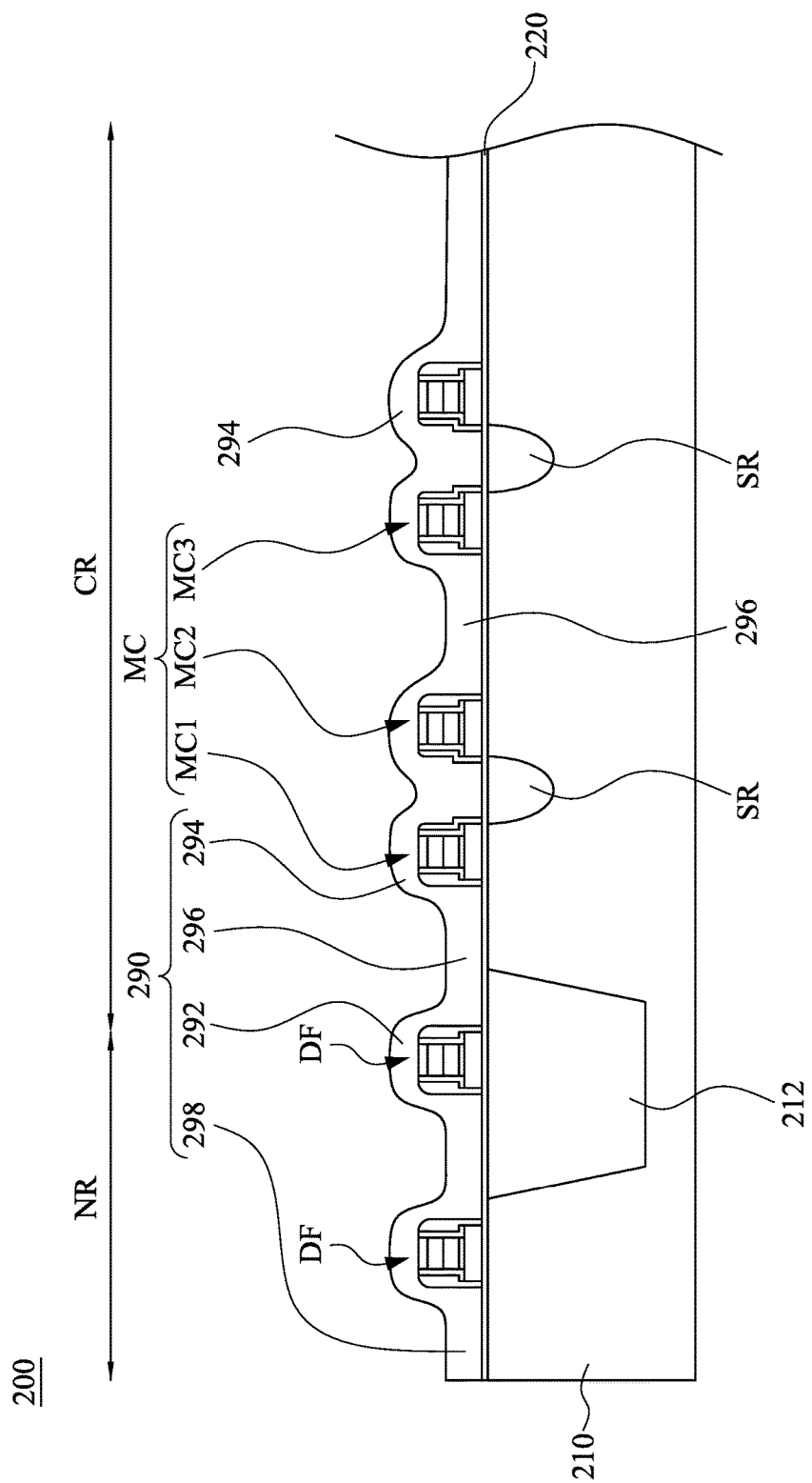

Referring to FIG. 1 and FIG. 2H, the method 100 proceeds to step 106 by forming a gate electrode layer 290 on the memory cells MC and the dummy features DF. Referring to FIG. 2H, the gate electrode layer 290 is formed over the substrate 210 and overlying the memory cells MC and the dummy features DF. The gate electrode layer 290 may be made of polysilicon. Alternatively, the gate electrode layer 290 may include doped polysilicon, amorphous silicon, other suitable conductive materials, or combinations thereof. The gate electrode layer 290 may be formed by CVD, plasma-enhanced chemical vapor deposition (PECVD), LPCVD, or other proper processes.

Herein, the gate electrode layer 290 includes upper portions 292, upper portions 294, recessed portions 296, and at least one recessed portion 298. The upper portions 292 are disposed on the dummy features DF. The upper portions 294 are disposed on the memory cells MC. The recessed portions 296 are disposed between the dummy features DF or/and the memory cells MC. The recessed portion 298 is disposed out of the outermost dummy feature DF. The upper portions 292, the upper portions 294, the recessed portions 296, and the recessed portion 298 may include substantially the same thickness. The upper surface S2 of the gate electrode layer 290 may conform to that of the resulting structure of FIG. 2F, such that projections of the upper portions 292 of the gate electrode layer 290 on the substrate 210 have a profile similar to the dummy features DF shown in FIG. 2F, and projections of the upper portions 294 of the gate electrode layer 290 on the substrate 210 have a profile similar to the memory cells MC shown in FIG. 2F.

Figure 2I:
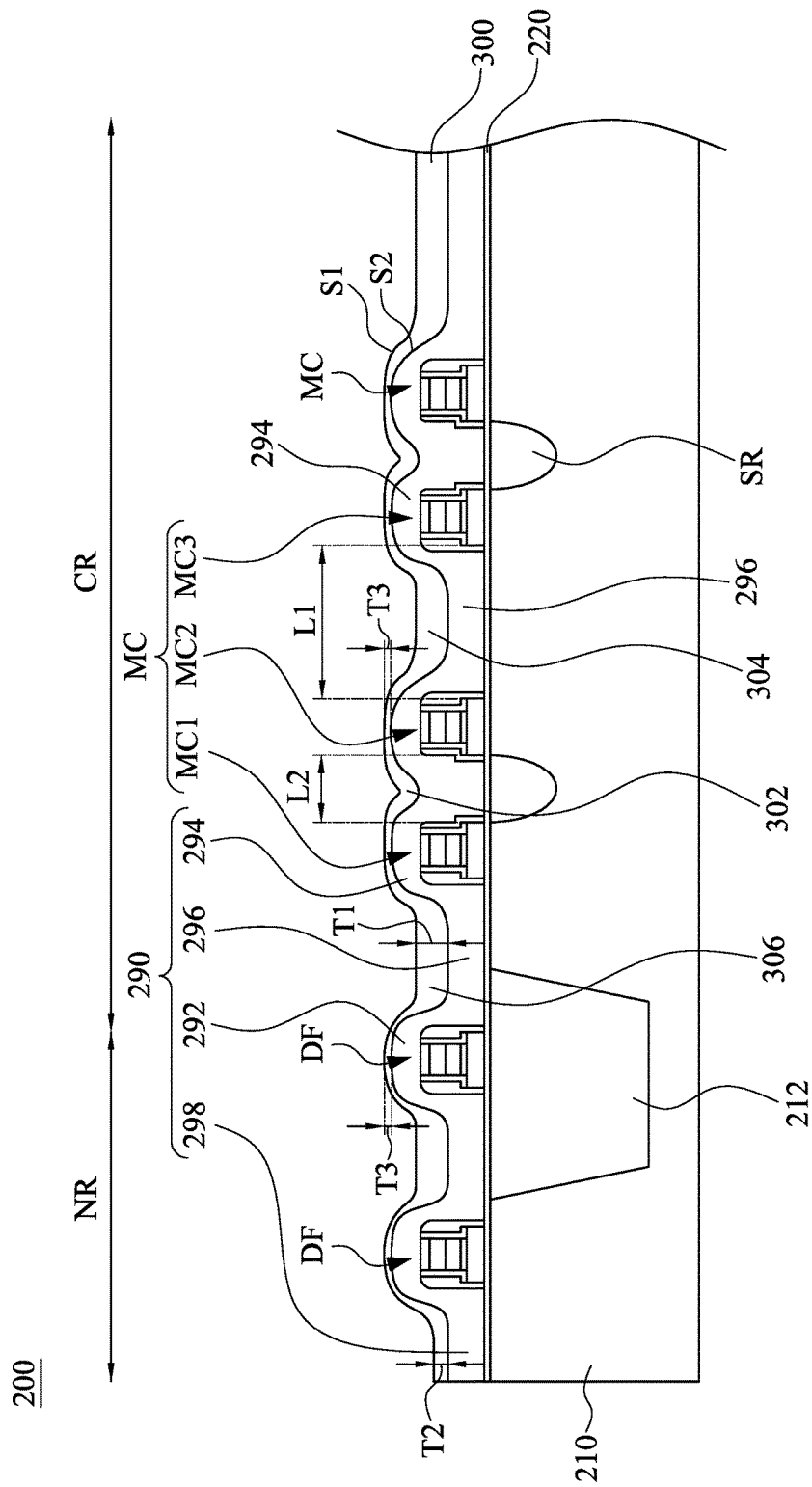

Referring to FIG. 1 and FIG. 2I, the method 100 proceeds to step 108 by applying a flowable material 300 on the gate electrode layer 290. Reference is made to both FIG. 2I and FIG. 2F.

In the absence of the dummy features DF, the gate electrode layer 290 in the non-cell region NR may be flat, and the flowable material 300 applied thereon may flow away from the substrate 210 (for example, away from the cell region CR), such that the flowable material 300 coated on the gate electrode layer 290 (for example, especially on the recessed portions 296) may be too thin to provide protection against the subsequent etching processes. Since the second distance L2 is longer than the first distance L1, parts 302 of the flowable material 300 applied the between two adjacent upper portions 294 above the memory cells MC of the same pairs (e. g. between the first memory cell MC1 and the second memory cell MC2) may have a shorter exiting length (e. g. the first distance L1) to flow away, while parts 304 of the flowable material 300 applied between two adjacent upper portions 294 above the memory cells MC of two adjacent pairs (e. g. between the second memory cell MC2 and the third memory cell MC3) has a wider exiting length (e. g. the second distance L2) to flow away. As a result, in the absence of the dummy features DF, it is easy for the parts 304 of the flowable material 300 to flow away from the cell region CR along the direction D1.

In the present embodiments, the positions of the portions P1 of the dummy features DF are designed to block the flow of the parts 304 of the flowable material 300, so as to reduce the flow rate. To be specific, the portions P1 of the dummy features DF and the upper portions 292 thereon are disposed corresponding to the spaces G1, so as to reduce the exiting length. For achieving a fine obstruction, the portions P1 of the dummy features DF may extend along a direction substantially orthogonal to the direction D1. Through the configuration, the parts 304 of the flowable material 300 may be confined in the spaces limited by the upper portions 294 above the two adjacent memory cells MC of the two adjacent pairs and the upper portions 292 above the corresponding portions P1 of the dummy features DF.

Also, the dummy feature DF may includes portions P2 extend along the direction D1, and at least one of the portions P2 and the adjacent one of the memory cells MC may limit parts 306 of the flowable material 300 from flowing away from the cell region CR in a direction orthogonal to the direction D1.

In addition to the structural confinement illustrated above, the configuration of the dummy features DF also increases the contact area between the flowable material 300 and the gate electrode layer 290, and therefore an adhesion force therebetween is enhanced and can reduce the flow rate of the flowable material 300.

Therefore, the flowable material 300 is prevented from flowing away from the cell region CR, and the flowable material 300 on the recessed portions 296 is thickened. For example, as shown in FIG. 2I, the flowable material 300 on the recessed portions 296 has a thicker thickness T1 than a thickness T2 of the flowable material 300 on the recessed portion 298, which is out of the outermost dummy feature DF in the non-cell region NR.

In addition, with the influence of gravity, the thickness of the flowable material 300 changes gradually based on the variation of the heights of the gate electrode layer 290. To be specific, the flowable material 300 may have a thickness T3 on the upper portions 292 and 294 of the gate electrode layer 290, and the thickness T1 on the recessed portions 296 of the gate electrode layer 290 is thicker than the thickness T3. Due to the variation of the thickness of the flowable material 300, the upper surface S1 of the flowable material 300 is more uniform than the upper surface S2 of the gate electrode layer 290. That is, the upper surface S1 of the semiconductor structure 200 in FIG. 2I is more uniform than the upper surface S2 of the semiconductor structure 200 in FIG. 2H.

In some embodiments, the flowable material 300 has a low viscosity in a range from 1 micron pascal-second to 300 pascal-seconds. In some embodiments, the flowable material 300 is bottom anti-reflective coating (BARC), which includes inorganic or organic material. In some embodiments, the flowable material 300 includes organic material that is photocurable. For example, the flowable material 300 may be a photoresist. Alternatively, in some embodiments, the flowable material 300 may be other removable materials. The flowable material 300 may be formed using appropriate spin-on techniques.

Figure 2J:
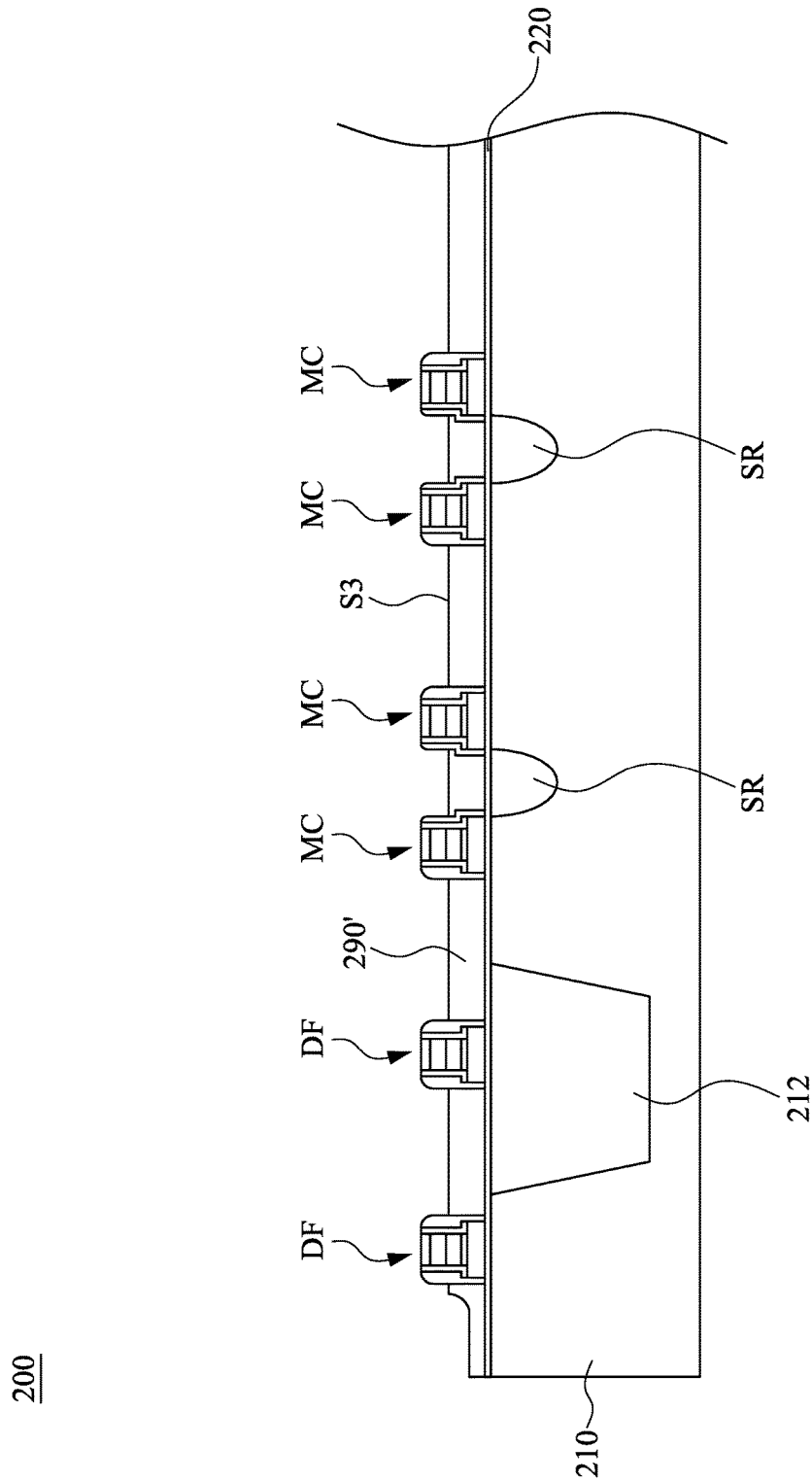

Referring to FIG. 1, FIG. 2I, and FIG. 2J, the method 100 proceeds to step 110 by removing the flowable material 300 and at least a portion of the gate electrode layer 290 above the memory cells MC and the dummy features DF.

Herein, an etching back process is performed. The etching back process may be performed without masking the regions between the dummy features DF or/and the memory cells MC. The etching back process reduces the height of the upper surface S1 of the semiconductor structure 200, and may stop when the top surfaces of the memory cells MC are exposed. Due to the protection of the flowable material 300 with varying thickness, the etching back process can remove the flowable material 300, the upper portions 292, and the upper portions 294 while leaving at least portions of the recessed portions 296 and the recessed portions 298 of the gate electrode layer 290. Therefore, as shown in FIG. 2J, the remaining gate electrode layer 290' is left.

In other words, since the configuration of the dummy features DF thickens the flowable material 300 above the recessed portions 296 and makes the upper surface of the semiconductor structure 200 become more uniform (e. g. the surface S1 is more uniform than the surface S2), the remaining gate electrode layer 290' may be thickened and has a uniform upper surface S3 as well.

Herein, the thickness of the remaining gate electrode layer 290' may relate to etching rates of the gate electrode layer 290 and the flowable material 300 and a difference between the thickness T3 and the thickness T1 of the flowable material 300. In some embodiments, the resulting upper surface S3 of the remaining gate electrode layer 290' is adjusted below the top surfaces of the memory cells MC and the dummy features DF. Alternatively, though it is not shown, in some embodiments, the resulting upper surface S3 of the remaining gate electrode layer 290' may be substantially level with the upper surfaces of the memory cells MC and the dummy features DF.

Figure 2K:
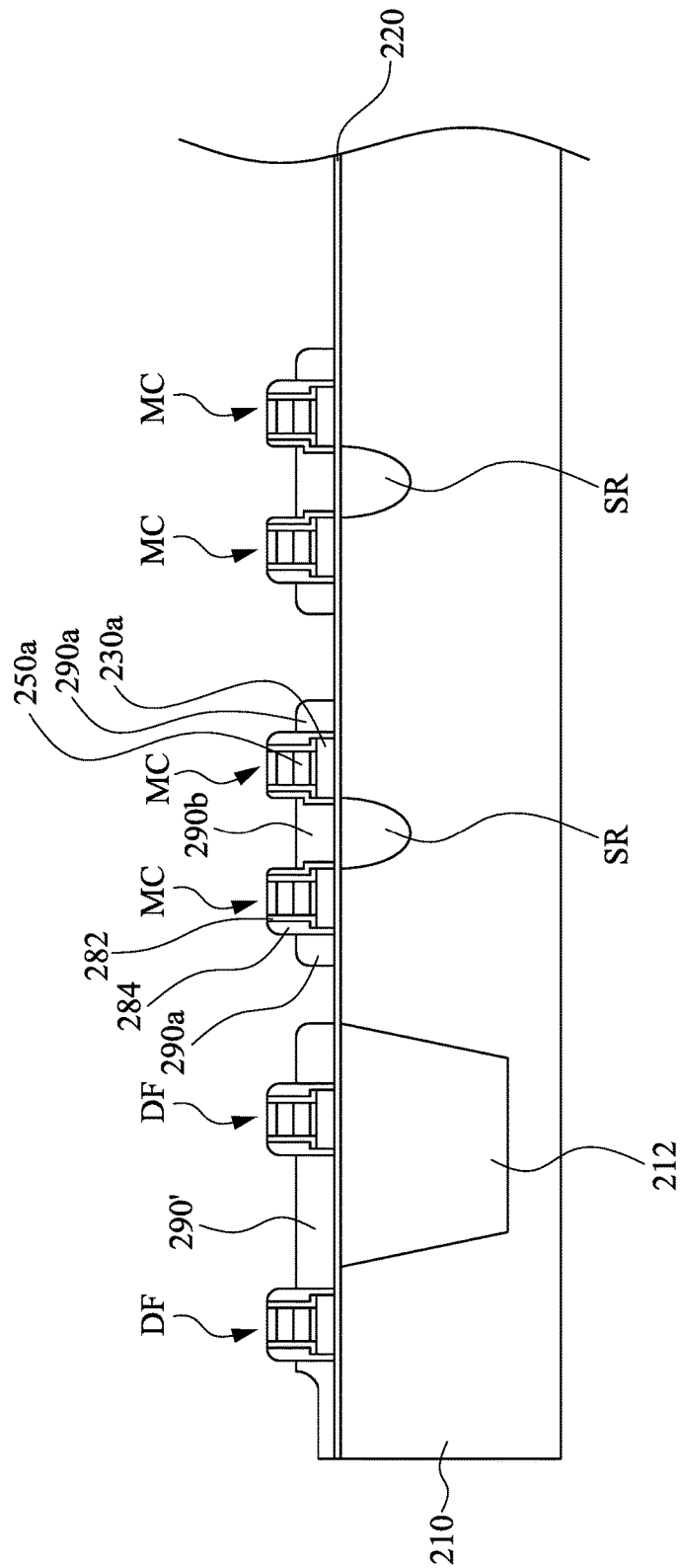

Referring to FIG. 1, FIG. 2J and FIG. 2K, the method 100 proceeds to step 112 by patterning the remaining gate electrode layer 290' to form word lines 290a and erase gates 290b. As shown in FIG. 2K, at least one of the word lines 290a is formed adjacent to the floating gate layer 230a and the control gate layer 250a of one of the memory cells MC, and at least one of the erase gates 290b is formed between at least one pair of the memory cells MC, above at least one of the source regions SR, and adjacent to the floating gate layers 230a and the control gate layers 250a of the pair of the memory cells MC. Through the configuration of the dummy features DF, since the remaining gate electrode layer 290' (referring to FIG. 2J) is thickened and has the uniform upper surface S3 (referring to FIG. 2J) as illustrated previously, the substrate 210 is prevented from being over-etched during patterning the remaining gate electrode layer 290'.

Reference is made to both FIG. 2F and FIG. 2K. In some embodiments, the openings O1 of the dummy features DF at least partially laterally overlaps with the erase gates 290b respectively. It may be understood that the source regions SR indicates the location of the erase gates 290b, which are not substantially depicted in FIG. 2F. In other word, projections of the erase gates 290b on the dummy features DF at least partially overlap with the openings O1 of the raised dummy features DF respectively. Through the configuration, the dummy features DF may occupy less space on the substrate 210 without influencing the flow rate of the flowable material.

Herein, the remaining gate electrode layer 290' adjacent to the dummy features DF is not removed. In some embodiments, the remaining gate electrode layer 290' adjacent to the dummy features DF may be removed during the formation of the word lines 290a.

Figure 2L:
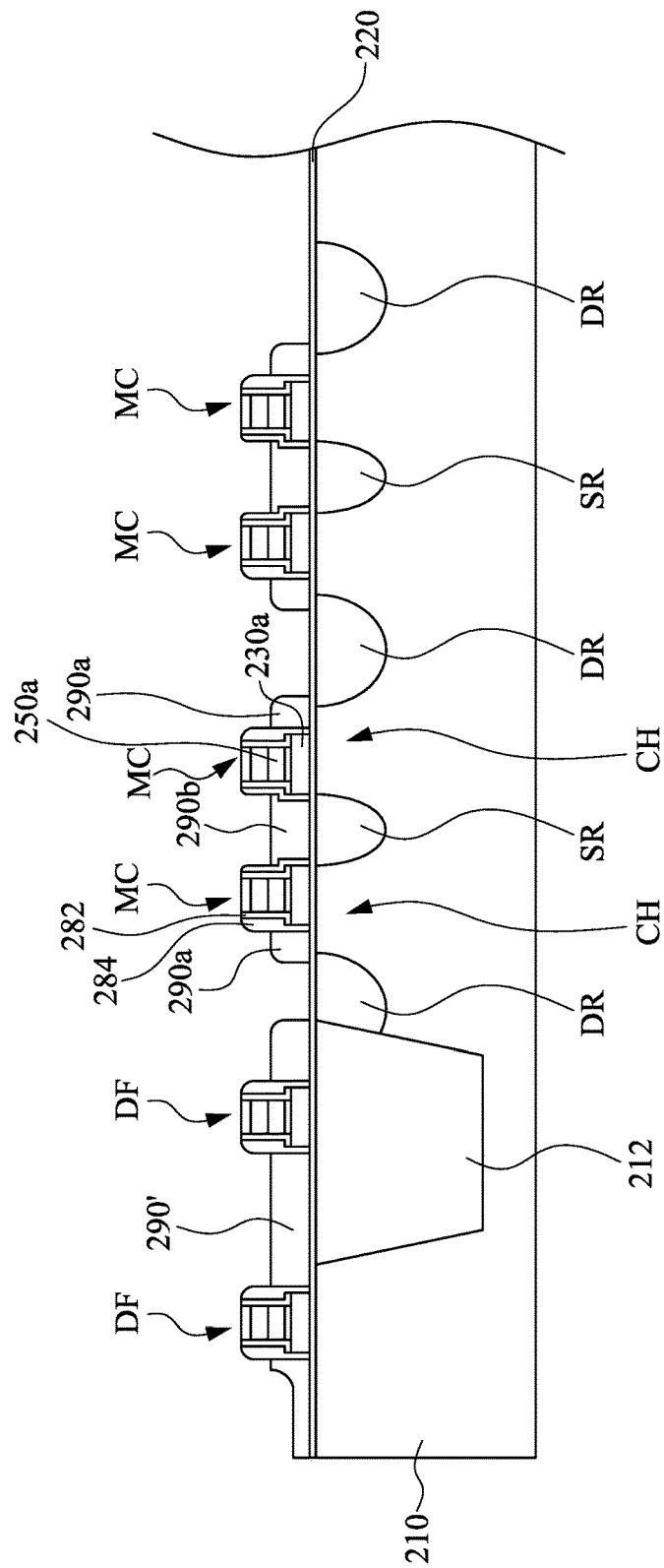

Referring to FIG. 1 and FIG. 2L, after the formation of the word lines 290a and the erase gates 290b, drain regions DR may be formed in the substrate 210 adjacent to the memory cells MC. The drain regions DR may be formed by one or more ion implantation processes. Alternatively, the drain regions DR may be portions of an epitaxy layer. The drain regions DR may diffuse and extend beneath the edge portions of the word lines 290a respectively, and are shared with the word lines of another pair of the memory cells (not shown).

The semiconductor structure 200 are formed with the plural memory cells MC, and each of the memory cells MC can be erased, programmed, and read by applying various voltages to the various portions for said memory cell MC (i.e. the word lines 290a, the erase gate 290b, the drain regions DR, the source region SR, and the control gate layer 250a associated with said memory cell MC). Herein, the operations of a selected one of the memory cells MC are briefly illustrated herein.

In some embodiments of the present disclosure, electrons can be transferred into the floating gate layer 230a through a variety of mechanisms. For example, a programming operation (also referred to as a writing operation) takes place in a channel region CH between the word line 290a and the floating gate layer 230a of the selected memory cell MC. The word lines 290a are also referred to as selection gates, which is capable of turning on or off the portion of the channel region CH under the word lines 290a. During the programming operation of the selected memory cell MC, the channel region CH under the word line 290a is turned on, and the control gate layer 250a may be biased to a high voltage, such that the memory cells MC can be electrically charged by injecting electrons from the drain region DR through the tunneling layer 220 onto the floating gate layer 230. In some other embodiments, through efficient hot-electron injection, a medium voltage may be applied to the source region SR to generate the hot electrons, electrons flow from the source region SR into the channel region CH, then hop up from the channel region CH and are stored in the floating gate layer 230a.

During an erasing operation of the selected memory cell MC, an electric field between the floating gate layer 230a and the erasing gate 290b are built such that electrons in the floating gate layer 230a move to the erasing gate 290b. In some examples, in the operation of the selected memory cell MC, the control gate layer 250a is either grounded or negatively biased, the erase gate 290b is biased positively, and the word line 290a and the drain region DR may be floating. Since a combination of the first sidewall spacer 282 and the second sidewall spacer 284 between the floating gate layer 230a of the selected memory cell MC and the erase gate 290b is thinner than a combination of the first sidewall spacer 282 and the second sidewall spacer 284 between the control gate layer 250a of the selected memory cell MC and the erase gate 290b, charges may be erased from the floating gate layer 230a to the erase gate 290b.

During a read operation, a voltage is applied on the word line 290a of the selected memory cell MC to turn on the portion of the channel region CH under the word line 290a. If the floating gate layer 230a of the selected memory cell MC is programmed with electrons, the portion of the channel region CH under the floating gate layer 230a will not conduct or provide little conduction. If the floating gate layer 230a of the selected memory cell MC is not programmed with electrons (in an erased state), the channel region CH under the floating gate layer 230a will be conductive. The conductivity of the channel region CH is sensed to determine if the floating gate layer 230a is programmed with electrons or not.

Herein, the memory cells MC and the dummy features DF are formed through substantially the same steps, and the stack layers of the memory cells MC may be substantially the same as that of the dummy features DF. One skilled in the art will realize that the teaching also applies to other semiconductor structures.

Figure 3A:
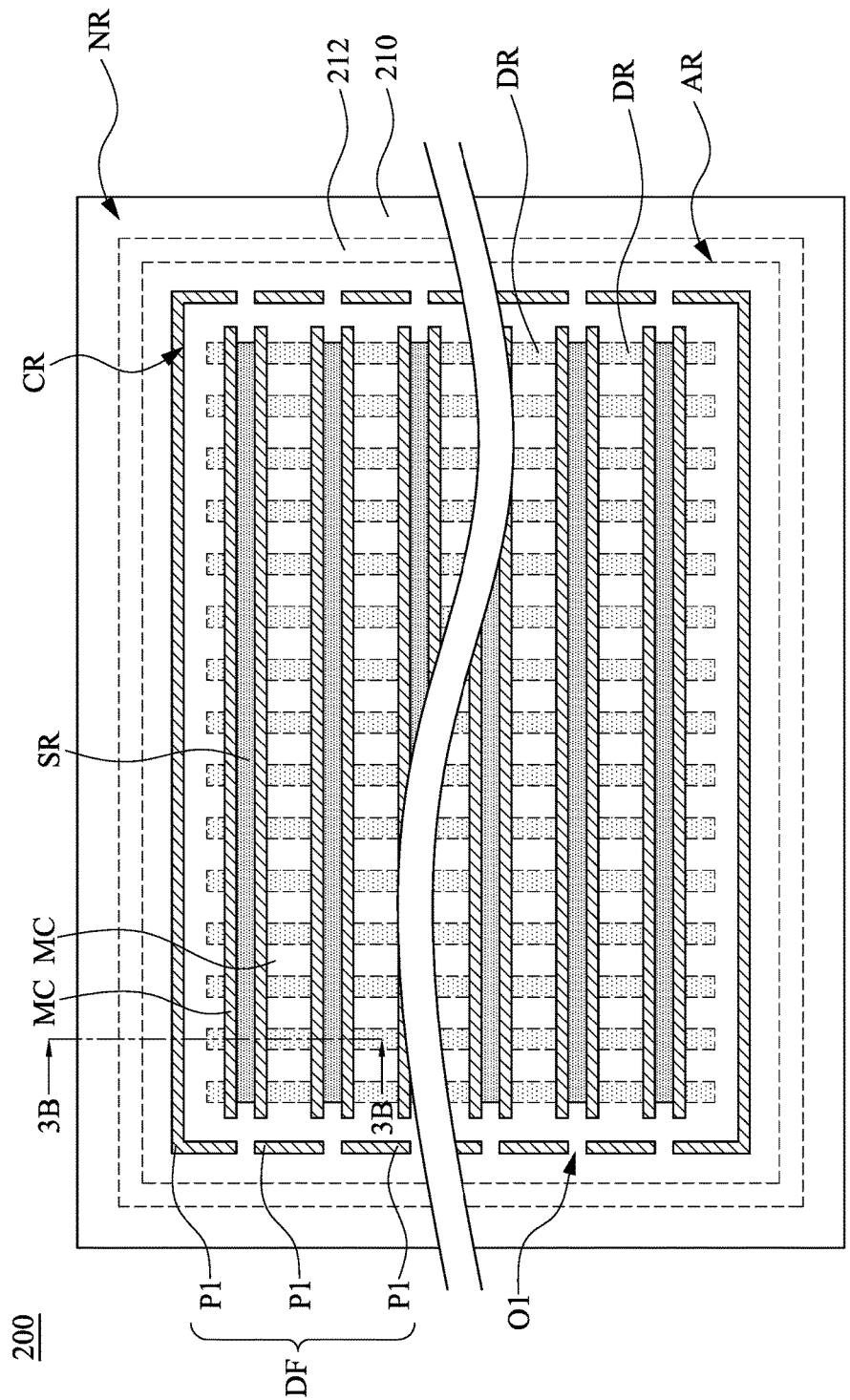
FIG. 3A is a top view of a semiconductor structure according to some embodiments of the present disclosure.
Figure 3B:
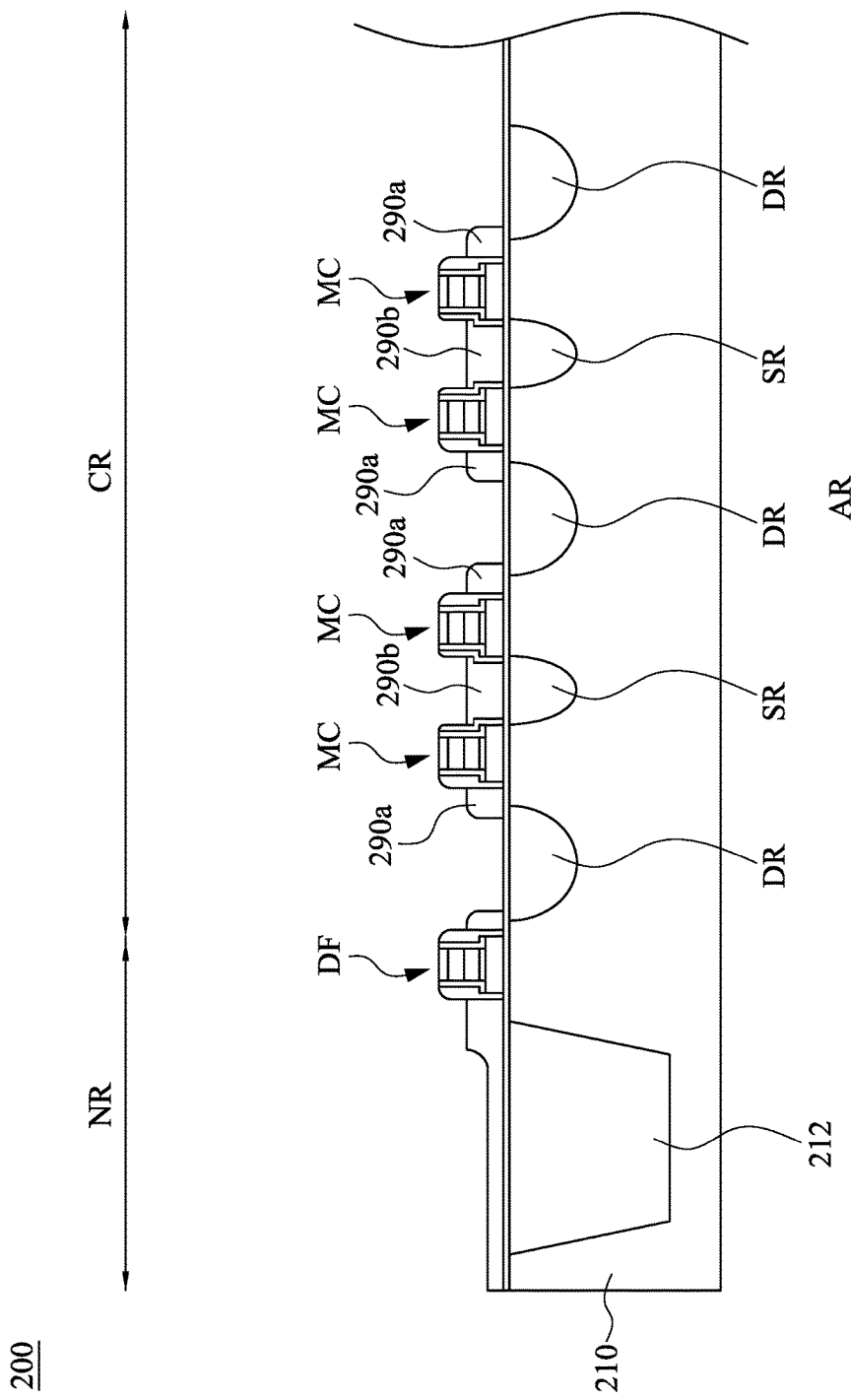
FIG. 3B is a cross-sectional view taken along line 3B-3B of FIG. 3A.

FIG. 3A is a top view of a semiconductor structure 200 according to some embodiments of the present disclosure. FIG. 3B is a cross-sectional view taken along line 3B-3B of FIG. 3A. The semiconductor structure 200 of FIGS. 3A and 3B is similar to the semiconductor structure 200 of FIG. 2F and FIG. 2L, and the difference between the semiconductor structure 200 of FIGS. 3A and 3B and the semiconductor structure 200 of FIG. 2F and FIG. 2L includes: the dummy feature DF is disposed on the active region AR defined by the isolation structure 212. Herein, the cell region CR has an area smaller than that of the active region AR.

As illustrated previously, through the dummy feature DF surrounds the memory cells MC, parts 304 of the flowable material 300 (shown in FIG. 2I) may be confined in the spaces limited by the upper portions 294 above the two adjacent memory cells MC of two adjacent pairs and the upper portions 292 above the corresponding portion P1 of the dummy feature DF, and parts 302 of the flowable material 300 (shown in FIG. 2I) may be confined in the spaces limited by the upper portions 294 above the two adjacent memory cells MC of the same pairs. Therefore, the dummy feature DF confines the flowable material (referring to the flowable material 300 in FIG. 2I) to stay in the cell region CR. Through the configuration, during the formation of the word lines 290a and the erase gates 290b, the substrate 210 is prevented from being over-etched. Other details of the embodiments of FIGS. 3A and 3B are similar to that of the embodiments of FIG. 2L, and therefore not repeated herein.

Figure 4:
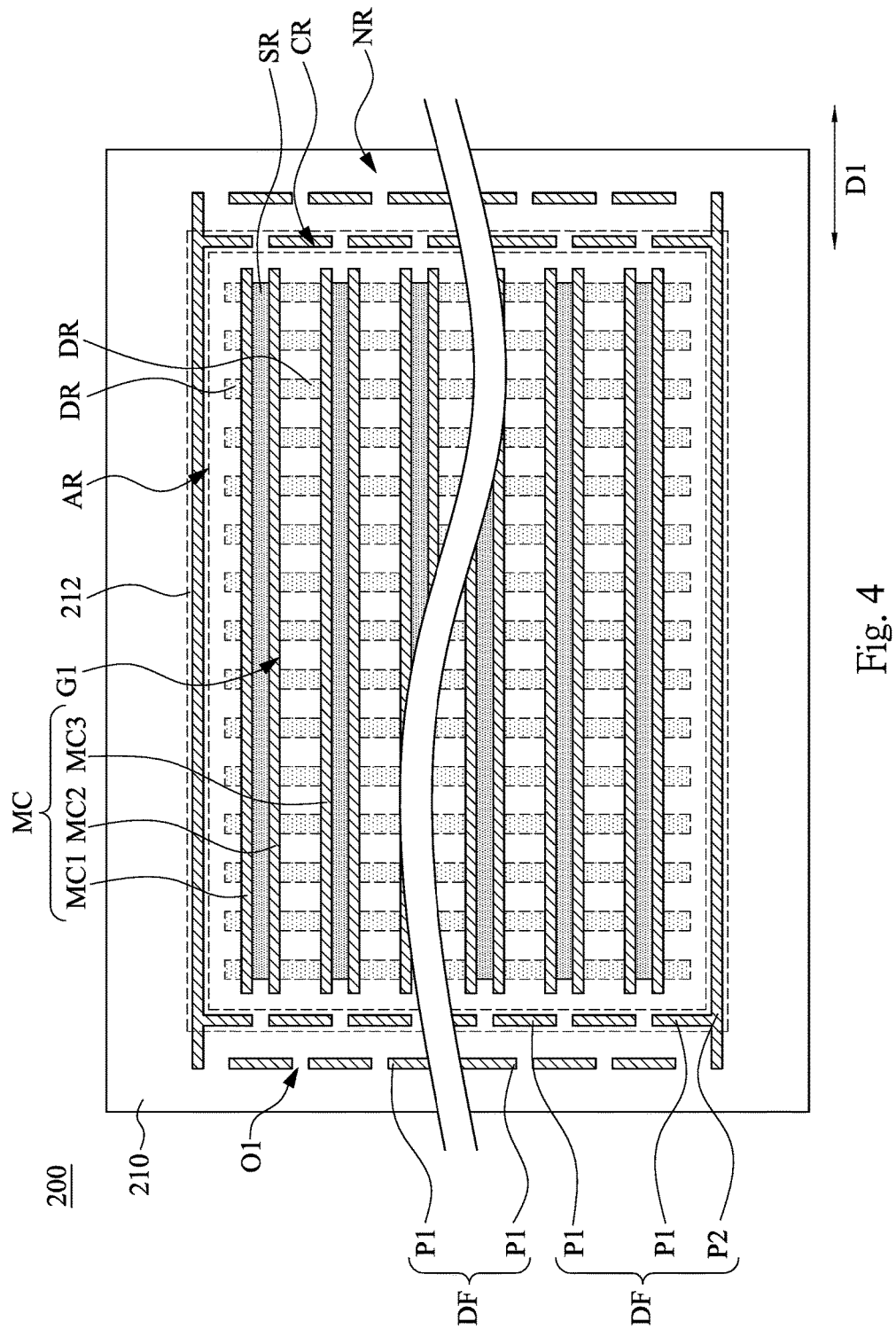
FIG. 4 is a top view of a semiconductor structure according to some embodiments of the present disclosure.

FIG. 4 is a top view of a semiconductor structure 200 according to some embodiments of the present disclosure. The semiconductor structure 200 of FIG. 4 is similar to the semiconductor structure 200 of FIG. 2F and FIG. 2L, and the difference between the semiconductor structure 200 of FIG. 4 and the semiconductor structure 200 of FIG. 2F and FIG. 2L includes: the positions of the openings O1 of one of the dummy features DF and the positions of the openings O1 of another one of the dummy features DF are staggered.

Herein, the positions of the openings O1 of the inner dummy feature DF and the positions of the openings O1 of another the outer dummy feature DF are staggered. For example, the openings O1 of the inner dummy feature DF are aligned with the pairs of the memory cells MC, while the openings O1 of the outer dummy feature DF are aligned with the portions P1 of the inner dummy feature DF. To be specific, the projections of the openings O1 of the inner dummy feature DF along D1 is overlapped with the projections of the portions P1 of the outer dummy feature DF along D1, instead of the projections of the openings O1 of the outer dummy feature DF along D1.

Through the configuration, the inner dummy feature DF confines the flowable material (referring to the flowable material 300 in FIG. 2I) to stay in the cell region CR. Though some flowable material may flow away from the cell region CR through the openings O1 of the inner dummy feature DF, the portions P1 of the outer dummy feature DF can limit the flowable material to stay in a portion of the non-cell region NR adjacent to the cell region CR. That is, the flow rate of the flowable material flowing through the openings O1 are reduced through the staggered configuration of the openings O1. As a result, during the formation of the word lines 290a and the erase gates 290b, the substrate 210 is prevented from being over-etched.

It should be noted that the openings O1 of the inner dummy feature DF and the outer dummy feature DF may be arranged without the consideration of the pairs of the memory cells MC. In some other embodiments, the openings O1 of the outer dummy feature DF are aligned with the pairs of the memory cells MC, while the openings O1 of the inner dummy feature DF are aligned with the portions P1 of the outer dummy feature DF.

In various embodiments of the present disclosure, through the configuration of dummy features, the flowable material is confined and prevented from flowing away from the substrate even if the flowable material has low viscosity, such that the substrate is prevented from being over-etched in the subsequent patterning process. Furthermore, in some embodiments of the present disclosure, the structure of the dummy feature is substantially the same as the structure of the memory cell, and therefore no additional steps are taken for the forming the dummy feature. The fabrication process of the dummy feature is well integrated with the fabrication process of the memory cell.

According to some embodiments of the present disclosure, a semiconductor structure includes a semiconductor substrate, at least one raised dummy feature, and at least one memory cell. The raised dummy feature is present on the semiconductor substrate and defines a cell region and a non-cell region outside of the cell region on the semiconductor substrate, and the raised dummy feature has at least one opening communicating the cell region with the non-cell region. The memory cell is present on the cell region.

According to some embodiments of the present disclosure, a semiconductor structure includes a semiconductor substrate, at least one memory cell, and at least one raised dummy feature. The semiconductor substrate has a cell region and a non-cell region outside of the cell region thereon. The memory cell is present on the cell region. The raised dummy feature is present outside of the cell region, in which the raised dummy feature has a dummy control gate layer therein, the memory cell has a control gate layer therein, and the dummy control gate layer of the raised dummy feature the control gate layer of the memory cell are made of substantially the same material, the raised dummy feature has at least one opening communicating the cell region with the non-cell region.

According to some embodiments of the present disclosure, a method for forming a semiconductor structure includes the following steps: forming at least one memory cell and at least one raised dummy feature surrounding the memory cell on a semiconductor substrate, in which the raised dummy feature has at least one opening therein; forming a gate electrode layer on the memory cell and the raised dummy feature, in which the gate electrode layer has an upper portion on the raised dummy feature and an inner recessed portion surrounded by the upper portion; and applying a flowable material on the gate electrode layer, in which the flowable material is at least partially confined by the upper portion of the gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   at least one raised dummy feature on the semiconductor substrate, wherein the raised dummy feature has a dummy floating gate layer and a dummy control gate layer directly above the dummy floating gate layer, the raised dummy feature is a boundary between a cell region and a non-cell region outside of the cell region on the semiconductor substrate, the raised dummy feature has at least one opening, the raised dummy feature includes a first portion that is U shaped in a top view and that is at a first side of the cell region, and the cell region is connected with the non-cell region through the opening of the raised dummy feature; and
   at least one memory cell on the cell region.

2. The semiconductor structure of claim 1, further comprising:
   at least one erase gate between at least one pair of the memory cells, wherein the pair of the memory cells extend along a direction, and the opening of the raised dummy feature is aligned with the erase gate in the direction.

3. The semiconductor structure of claim 1, further comprising:
   at least one erase gate between at least one pair of the memory cells, wherein the pair of the memory cells extend along a direction, and the opening of the raised dummy feature is aligned with said pair of the memory cells in the direction.

4. The semiconductor structure of claim 1, wherein the memory cell has a control gate layer therein, and the dummy control gate layer of the raised dummy feature and the control gate layer of the memory cell are made of substantially the same material.

5. The semiconductor structure of claim 1, wherein the memory cell has a floating gate layer therein, and the dummy floating gate layer of the raised dummy feature and the floating gate layer of the memory cell are made of substantially the same material.

6. The semiconductor structure of claim 1, further comprising:
   at least one isolation structure in the semiconductor substrate for surrounding at least one active region, wherein the memory cell is on the active region, and the raised dummy feature is outside of the active region.

7. The semiconductor structure of claim 1, further comprising:
   at least one isolation structure in the semiconductor substrate for surrounding at least one active region, wherein the memory cell and the raised dummy feature are on the active region.

8. The semiconductor structure of claim 1, further comprising:
   at least one isolation structure in the semiconductor substrate for surrounding at least one active region, wherein the memory cell is on the active region, and the raised dummy feature is above the isolation structure.

9. The semiconductor structure of claim 1, wherein the raised dummy feature further includes a second portion that is U shaped in the top view and that is at a second side of the cell region opposite to the first side of the cell region.

10. The semiconductor structure of claim 1, wherein the first portion of the raised dummy feature has parallel segments that have the same length.

11. The semiconductor structure of claim 1, further comprising an outer raised dummy feature having at least one opening, wherein the opening of the raised dummy feature and the opening of the outer raised dummy feature are aligned with each other.

12. The semiconductor structure of claim 1, further comprising an outer raised dummy feature having an opening, wherein the raised dummy feature further includes a second portion that is straight line in the top view and aligned with the opening of the outer raised dummy feature.

13. The semiconductor structure of claim 1, wherein the raised dummy feature further includes a plurality of second portions that are straight lines in the top view and separated by the openings in the raised dummy feature.

14. A semiconductor structure, comprising:
a semiconductor substrate having a cell region and a non-cell region outside of the cell region thereon;
at least one memory cell on the cell region; and
at least one raised dummy feature outside of the cell region, wherein the raised dummy feature has a dummy floating gate layer and a dummy control gate layer directly above the dummy floating gate layer, the memory cell has a control gate layer therein, the dummy control gate layer of the raised dummy feature and the control gate layer of the memory cell are made of substantially the same material, the raised dummy feature has at least one opening, the raised dummy feature includes a plurality of spaced apart first portions at a first side of the cell region and a plurality of spaced apart second portions at a second side of the cell region opposite the first side of the cell region, and the cell region is connected with the non-cell region through the opening of the raised dummy feature.

15. The semiconductor structure of claim 14, further comprising:
at least one erase gate between at least one pair of the memory cells, wherein the pair of the memory cells extend along a direction, and are aligned with the opening of the raised dummy feature in the direction.

16. The semiconductor structure of claim 14, wherein the control gate layer and the dummy control gate layer have top surfaces that are at the same level and are separated from each other.

17. The semiconductor structure of claim 14, wherein the raised dummy feature includes a third portion that surrounds a corner of the cell region.

18. A semiconductor structure, comprising:
a semiconductor substrate;
at least one pair of memory cells on a cell region of the semiconductor substrate;
at least one erase gate between the pair of the memory cells; and
at least one raised dummy feature on the semiconductor substrate, wherein the raised dummy feature includes a dummy floating gate layer and a dummy control gate layer directly above the dummy floating gate layer, the raised dummy feature surrounds the pair of the memory cells, the raised dummy feature has an opening, and the raised dummy feature includes a portion that is π shaped in a top view and that is at a first side of the cell region.

19. The semiconductor structure of claim 18, wherein the pair of the memory cells extends along a direction, and the portion of the raised dummy feature partially extends along the direction.

20. The semiconductor structure of claim 18, wherein the raised dummy feature further includes a second portion that is π shaped in the top view and that is at a second side of the cell region opposite the first side of the cell region.

* * * * *